(12) United States Patent
Oka

(10) Patent No.: US 11,049,743 B2
(45) Date of Patent: Jun. 29, 2021

(54) SUBSTRATE PROCESSING APPARATUS, FLOW RATE CONTROL METHOD, AND STORAGE MEDIUM STORING FLOW RATE CONTROL PROGRAM

(71) Applicant: TOKYO ELECTRON LIMITED, Tokyo (JP)

(72) Inventor: Shinsuke Oka, Miyagi (JP)

(73) Assignee: TOKYO ELECTRON LMITED, Tokyo (JP)

( * ) Notice: Subject to any disclaimer, the term of this patent is extended or adjusted under 35 U.S.C. 154(b) by 0 days.

(21) Appl. No.: 16/273,622

(22) Filed: Feb. 12, 2019

(65) Prior Publication Data

US 2019/0252224 A1 Aug. 15, 2019

(30) Foreign Application Priority Data

Feb. 15, 2018 (JP) .............................. JP2018-024783

(51) Int. Cl.
*H01J 37/32* (2006.01)
*H01L 21/67* (2006.01)
*H01L 21/66* (2006.01)

(52) U.S. Cl.
CPC ...... *H01L 21/67253* (2013.01); *H01J 37/321* (2013.01); *H01J 37/32174* (2013.01); *H01J 37/32449* (2013.01); *H01L 21/67069* (2013.01); *H01L 22/12* (2013.01)

(58) Field of Classification Search
CPC ............... H01L 21/67253; H01L 22/12; H01L 21/67069; H01J 37/321; H01J 37/32174; H01J 37/32449; H01J 37/32935

USPC ........................ 118/715; 156/345.31, 345.32
See application file for complete search history.

(56) References Cited

U.S. PATENT DOCUMENTS

| 6,829,056 | B1 * | 12/2004 | Barnes ............... | H01J 37/32935 |
| | | | | 118/708 |
| 9,425,028 | B2 * | 8/2016 | Kuwabara ......... | H01J 37/32036 |
| 2016/0225681 | A1 * | 8/2016 | Asakura ................. | G01N 21/68 |

FOREIGN PATENT DOCUMENTS

| CN | 1596061 A | 3/2005 |
| JP | 9-45624 A | 2/1997 |
| JP | 2007-208194 A | 8/2007 |

* cited by examiner

*Primary Examiner* — Rudy Zervigon
(74) *Attorney, Agent, or Firm* — Rothwell, Figg, Ernst & Manbeck, P.C.

(57) ABSTRACT

An upper electrode is disposed in a processing container to face a wafer and configured to adjust a flow rate of a processing gas for each of divided regions obtained by dividing a facing surface that faces the wafer. A calculator calculates a target flow rate of the processing gas of each of the divided regions where a critical dimension (CD) of a measurement point satisfies a predetermined condition using a prediction model for predicting the CD at a predetermined measurement point of the wafer when plasma etching is performed on the wafer using the flow rate of the processing gas in each of the divided regions as a parameter. A flow rate controller performs a flow rate control such that the flow rate of the processing gas supplied from each of the divided regions of the upper electrode becomes the calculated target flow rate.

14 Claims, 9 Drawing Sheets

US 11,049,743 B2

SUBSTRATE PROCESSING APPARATUS, FLOW RATE CONTROL METHOD, AND STORAGE MEDIUM STORING FLOW RATE CONTROL PROGRAM

CROSS-REFERENCE TO RELATED APPLICATIONS

This application is based on and claims priority from Japanese Patent Application No. 2018-024783, filed on Feb. 15, 2018, with the Japan Patent Office, the disclosures of which are incorporated herein in their entireties by reference.

TECHNICAL FIELD

Various aspects and embodiments of the present disclosure relate to a substrate processing apparatus, a flow rate control method, and a storage medium storing a flow rate control program.

BACKGROUND

In the related art, there has been known a substrate processing apparatus that supplies a predetermined processing gas into a processing container and performs a substrate processing such as film formation or etching on a substrate such as, for example, a semiconductor wafer or a liquid crystal substrate. For example, a plasma processing apparatus is known for such a substrate processing apparatus. A plasma processing apparatus is configured by disposing, for example, a lower electrode which also serves as a placement table to place a substrate thereon in a processing container and an upper electrode which also serves as a shower head to eject a processing gas toward the substrate. In such a plasma processing apparatus, a substrate processing such as, for example, film formation or etching may be performed by applying radio-frequency power between both electrodes in a state in which a processing gas is supplied from the shower head onto the substrate in the processing container so as to generate plasma.

Incidentally, one of precisions concerning a substrate processing is the uniformity of critical dimensions in the substrate. In substrate processing, the progress of a processing changes due to various factors such as, for example, a gas concentration of a processing gas supplied from the shower head. Therefore, in a plasma processing apparatus, the interior of the shower head is divided into a plurality of gas chambers and a gas supply pipe is independently connected for each gas chamber, so that an arbitrary kind of processing gas may be supplied to a plurality of portions in a substrate surface at an arbitrary flow rate. See, for example, Japanese Patent Laid-Open Publication Nos. 09-045624 and 2007-208194.

SUMMARY

In an embodiment, a substrate processing apparatus disclosed herein includes a gas supply source, a calculator, and a flow rate controller. The gas supply source is disposed in a processing container to face a substrate, and configured to adjust a flow rate of a processing gas to be supplied for each of divided regions obtained by dividing a facing surface that faces the substrate. The calculator calculates a target flow rate of the processing gas of each of the divided regions where an critical dimension of a predetermined measurement point of the substrate satisfies a predetermined condition using a prediction model for predicting the critical dimension at the predetermined measurement point of the substrate when a predetermined substrate processing is performed on the substrate using a flow rate of the processing gas of each of the divided regions as a parameter. The flow rate controller performs a flow rate control such that the flow rate of the processing gas supplied from each of the divided regions of the gas supply source becomes the target flow rate calculated by the calculator when performing the substrate processing on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
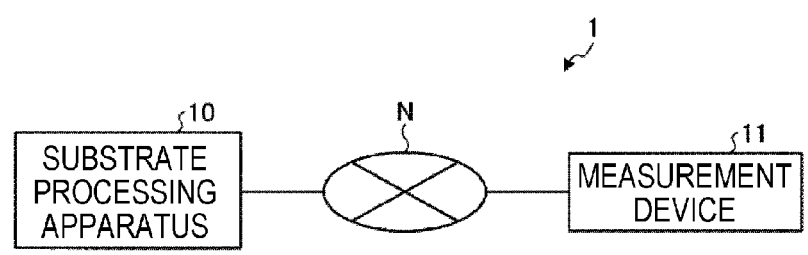
FIG. 1 is a view illustrating a schematic configuration of a substrate processing system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of a plasma processing apparatus, a flow rate control method, and a flow rate control method disclosed herein will be described in detail with reference to the accompanying drawings. In respective drawings, the same or corresponding parts will be denoted by the same reference numerals. However, the present disclosure is not limited by the embodiments. In addition, respective embodiments may be appropriately combined within a range not inconsistent with processing contents.

First Embodiment

[Configuration of Substrate Processing System]

First, a schematic configuration of a substrate processing system according to an embodiment will be described. The substrate processing system is a system that performs a predetermined substrate processing on a substrate such as a wafer. In the present embodiment, the case where a plasma etching is performed on the substrate as a substrate processing will be described as an example. FIG. 1 is a view illustrating a schematic configuration of a substrate processing system according to the present embodiment. The substrate processing system 1 includes a substrate processing apparatus 10 and a measurement device 11. The substrate processing apparatus 10 and the measurement device 11 are connected to each other so as to communicate with each other via a network N. For the network N, any type of communication network such as a local area network (LAN) or a virtual private network (VPN) may be adopted regardless of whether the network is wired or wireless.

The substrate processing apparatus 10 is an apparatus that performs a predetermined substrate processing on a substrate. In the present embodiment, the substrate processing apparatus 10 performs a plasma etching on a semiconductor wafer (hereinafter, referred to as a "wafer") as a substrate.

The measurement device 11 is a device that measures a critical dimension at a measurement point, using a predetermined position on a substrate on which a substrate processing has been performed by the substrate processing apparatus 10 as the measurement point. In the present embodiment, the measurement device 11 measures the width of a pattern at a measurement point as a critical dimension. Hereinafter, the critical dimension is also referred to as "CD." A plurality of measurement points for measuring CD are provided at different positions on a wafer. The measurement device 11 measures the width of the pattern at each measurement point. The measurement device 11 may be an inspection device that inspects defects on a substrate. The measurement device 11 transmits the measured CD data of each measurement point to the substrate processing apparatus 10.

In the substrate processing apparatus 10, a shower head configured to eject a processing gas toward a wafer has a facing surface facing the wafer and divided into a plurality of divided regions, and a control for adjusting the flow rate of the processing gas ejected from each divided region is performed based on the CD data of each measurement point received from the measurement device 11 so as to the CD at each measurement point of the wafer satisfies a predetermined condition.

[Configuration of Substrate Processing Apparatus]

Figure 2:
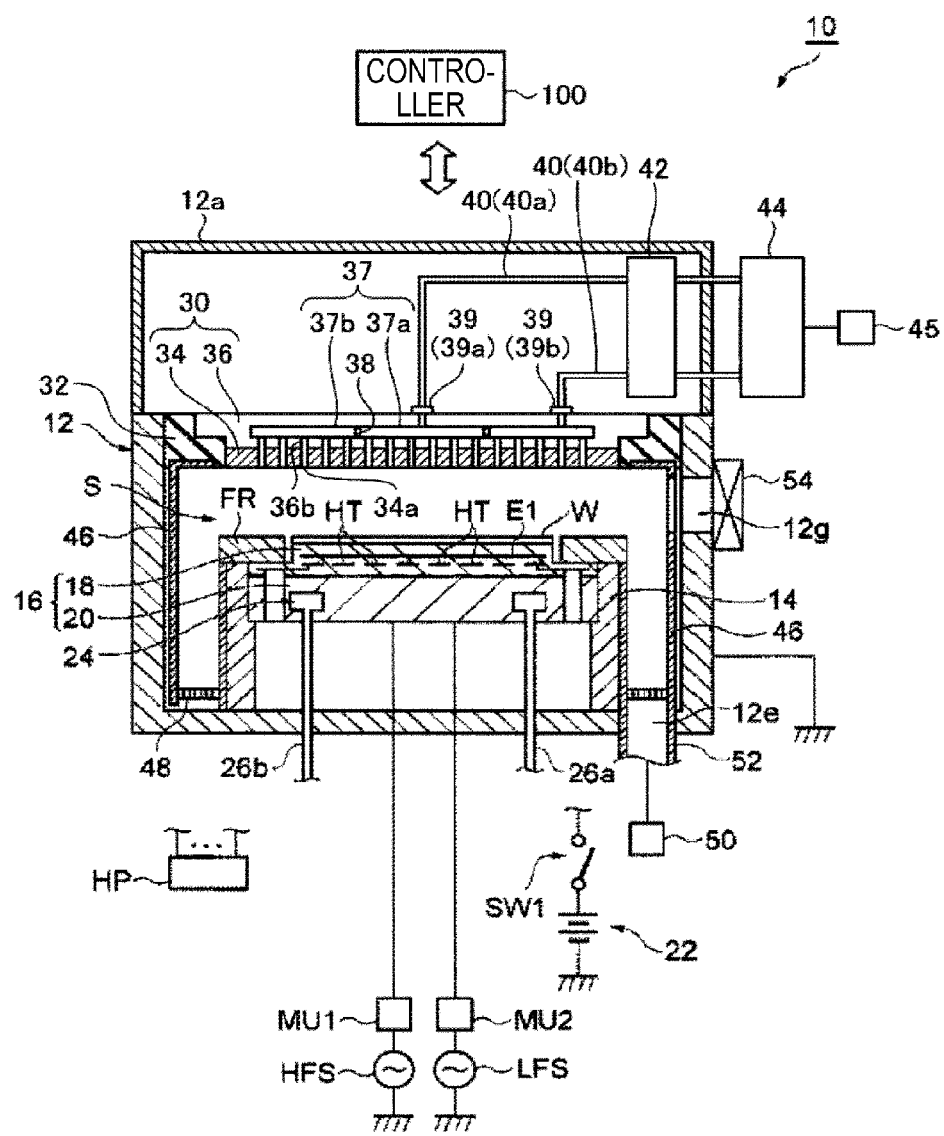
FIG. 2 is a view schematically illustrating a substrate processing apparatus according to an embodiment.

Next, the configuration of the drying processing apparatus 10 will be described. FIG. 2 is a view schematically illustrating a substrate processing apparatus according to an embodiment. FIG. 2 schematically illustrates a structure in a vertical cross section of the plasma processing apparatus 10 according to an embodiment. The plasma processing apparatus 10 illustrated in FIG. 2 is a capacitively coupled parallel plate plasma etching apparatus. The plasma processing apparatus 10 includes a substantially cylindrical processing container 12. The processing container 12 is made of, for example, aluminum. In addition, the surface of the processing container 12 is subjected to an anodic oxidation treatment.

A placement table 16 is provided in the processing container 12. The placement table 16 includes an electrostatic chuck 18 and a base 20. The top surface of the electrostatic chuck 18 serves as a placement surface on which a substrate to be subjected to a substrate processing is placed. In the present embodiment, a wafer W to be subjected to a plasma etching is placed on the top surface of the support member 18. The base 20 has a substantially disk shape, and the main portion thereof is made of a conductive metal such as, for example, aluminum. The base 20 constitutes a lower electrode. The base 20 is supported by a support unit 14. The support unit 14 is a cylindrical member extending from the bottom portion of the processing container 12.

A first radio-frequency power supply HFS is electrically connected to the base 20 via a matching unit MU1. The first radio-frequency power supply HFS is a power supply configured to generate first radio-frequency power for plasma generation and generates radio-frequency power of 27 to 100 MHz, for example, 40 MHz. The matching unit MU1 has a circuit configured to match the output impedance of the first radio-frequency power supply HFS and a load side (base 20 side) input impedance.

A second radio-frequency power supply LFS is electrically connected to the base 20 via a matching unit MU2. The second radio-frequency power supply LFS generates radio-frequency power (radio-frequency bias power) for drawing ions into the wafer W, and supplies the radio-frequency bias power to the base 20. The frequency of the radio-frequency power is in the range of 400 kHz to 13.56 MHz, for example, 3 MHz. The matching unit MU2 has a circuit configured to match the output impedance of the second radio-frequency power supply LFS and the load side (base 20 side) input impedance.

On the base 20, a support member 18 is provided. In an embodiment, the support member is an electrostatic chuck. The support member 18 attracts the wafer W by an electrostatic force such as, for example, Coulomb force so as to hold the wafer W. The electrostatic chuck 18 has an electrode E1 for electrostatic attraction in a ceramic main body thereof. A direct current (DC) power supply 22 is electrically connected to the electrode E1 via a switch SW1.

Inside the support member 18, a heater HT is provided below the electrode E1. The heater HT is connected to a heater power supply HP via wiring (not illustrated) provided on the outer peripheral portion of the base 20. The heater HT controls the temperature of the wafer W by generating heat depending on power supplied from the heater power supply HP.

A focus ring FR is provided on the top surface of the base 20 and around the electrostatic chuck 18. The focus ring FR is provided in order to improve the uniformity of plasma processing. The focus ring FR is made of a material appropriately selected depending on the plasma processing to be performed, and may be made of, for example, silicon or quartz.

Inside the base 20, a coolant flow path 24 is formed. Coolant is supplied to the coolant flow path 24 from a chiller unit provided outside the processing container 12 via a pipe 26a. The coolant supplied to the coolant flow path 24 is adapted to return to the chiller unit via a pipe 26b.

Inside the processing container 12, an upper electrode, which also serves as a shower head is provided to eject a gas toward the wafer W. In the substrate processing apparatus 10 of the present embodiment, the upper electrode 30 corresponds to a gas supply unit. The upper electrode 30 is disposed above the mounting table 16 to face the base 20, and the base 20 and the upper electrode 30 are provided substantially parallel to each other.

The upper electrode 30 is supported in the upper portion of the processing container 12 via an insulative shielding member 32. The upper electrode 30 may include an electrode plate 34 and an electrode support 36. The electrode plate 34 faces the processing space S and provides a plurality of gas ejection holes 34a. The electrode plate 34 may be made of a low-resistance conductor or semiconductor having little Joule heat.

The electrode support 36 detachably supports the electrode plate 34, and may be made of a conductive material such as, for example, aluminum. The electrode support 36 may have a water-cooled structure. A gas diffusion chamber 37, which is formed of a disk-shaped space, is provided inside the electrode support 36. The gas diffusion chamber 37 is divided into a plurality of gas chambers. For example, the gas chamber 37 is provided with an annular partition wall member 38. The gas diffusion chamber 37 is divided into two gas chambers in the radial direction by the partition wall member 38. For example, the gas diffusion chamber 37 is divided into an inner first gas diffusion chamber 37a formed of a disk-shaped space and a second gas diffusion chamber 37b formed of a ring-shaped space surrounding the first gas diffusion chamber 37a. The second gas diffusion chamber 37b is divided into a plurality of gas chambers in the circumferential direction by a partition wall member (not illustrated). In the present embodiment, the second gas diffusion chamber 37b is further divided into four gas chambers in the circumferential direction. A plurality of gas flow holes 36b, which respectively communicate with the gas ejection holes 34a, extend downward from the gas chambers obtained by dividing the gas diffusion chamber 37. In addition, the electrode support 36 is provided with gas inlets 39 that guide the processing gas for respective gas chambers obtained by dividing the gas diffusion chamber 37. In the example of FIG. 2, a gas inlet 39a configured to introduce the processing gas into a first gas diffusion chamber 37a and a gas inlet 39b configured to introduce the processing gas into one of respective gas chambers obtained by dividing the second gas diffusion chamber 37b are illustrated, and a gas inlet 39 configured to introduce the processing gas into another gas chamber is omitted. A gas supply pipe 40 is connected to each gas inlet 39. In the example of FIG. 2, a gas supply pipe 40a is connected to the first gas inlet 39a. A gas supply pipe 40b is connected to the second gas inlet 39b.

Each gas supply pipe 40 is connected to a gas source group 45 via a valve group 42 and a flow rate controller group 44. In the example of FIG. 2, the gas supply pipes 40a, 40b are connected to the gas source group 45 via the valve group 42 and the flow rate controller group 44. The valve group 42 has a plurality of opening/closing valves for individually opening and closing the gas supply pipes 40, respectively. The flow rate controller group 44 includes a plurality of flow rate controllers such as, for example, mass flow controllers for respective supply pipes 40. The gas source group 45 has gas sources for plural kinds of gases required for plasma processings such as plasma etching. A plurality of gas sources of the gas source group 45 are configured to be supplied to the respective gas supply pipes 40 via the valve group 42 and the flow rate controller group 44.

In the plasma processing apparatus 10, one or more gases from one or more gas sources selected from the plurality of gas sources of the gas source group 45 are supplied to respective gas supply pipes 40. The gases supplied to respective gas supply pipes 40 reach the gas chambers and are ejected into the processing space S through the gas flow holes 36b and the gas ejection holes 34a. For example, the gas supplied to the gas supply pipe 40a reaches the first gas diffusion chamber 37a and is ejected into the processing space S through the gas flow holes 36b and the gas ejection holes 34a.

In the substrate processing apparatus 10, by controlling the valve group 42 and the flow rate controller group 44, it is possible to individually control the flow rate of the processing gas supplied to each gas supply pipe 40. In the substrate processing apparatus 10, by controlling the valve group 42 and the flow rate controller group 44, the flow rate of the processing gas ejected from the gas ejection holes 34a of each gas chamber obtained by dividing the gas diffusion chamber 37 into the processing space S.

The plasma processing apparatus 10 may further include a ground conductor 12a. The ground conductor 12a is a substantially cylindrical ground conductor, and is provided so as to extend from the side wall of the processing container 12 to a position higher than the height position of the upper electrode 30.

In the plasma processing apparatus 10, a deposit shield 46 is detachably installed along the inner wall of the processing container 12. The deposit shield 46 is also installed on the outer periphery of the support unit 14. The deposit shield 46 prevents an etching byproduct (deposit) from adhering to the processing container 12, and may be configured by coating an aluminum material with ceramics such as $Y_2O_3$.

On the bottom side of the processing container 12, an exhaust plate 48 is provided between the support unit 14 and the inner wall of the processing container 12. The exhaust plate 48 may be configured by coating, for example, an aluminum material with ceramics such as, for example, $Y_2O_3$. An exhaust port 12e is provided in the processing container 12 below the exhaust plate 48. An exhaust device 50 is connected to the exhaust port 12e via an exhaust pipe 52. The exhaust device 50 has a vacuum pump such as, for example, a turbo molecular pump, and is capable of decompressing the inside of the processing container 12 to a desired degree of vacuum. A carry-in/out port 12g for a wafer W is provided in the sidewall of the processing container 12, and the carry-in/out port 12g is configured to be opened and closed by a gate valve 54.

The operation of the plasma processing apparatus 10 configured as described above is totally controlled by a controller 100. The controller 100 is, for example, a computer, and controls each unit of the plasma processing apparatus 10. The operation of the plasma processing apparatus 10 is totally controlled by the controller 100.

[Configuration of Upper Electrode]

Figure 3:
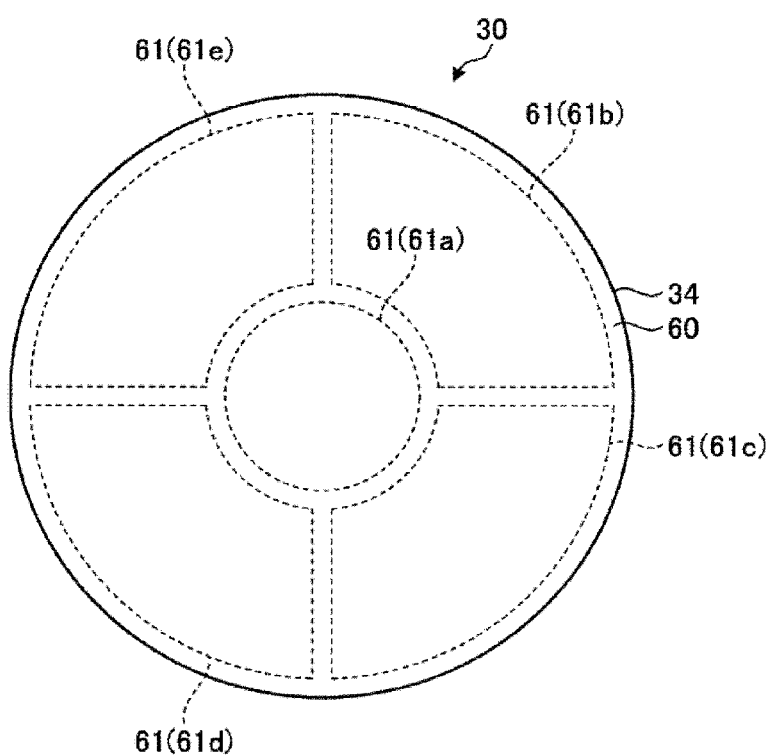
FIG. 3 is a plan view illustrating an upper electrode according to an embodiment.

Next, an upper electrode 30 will be described in detail. FIG. 3 is a plan view illustrating an upper electrode according to an embodiment. FIG. 3 illustrates a schematic plan view in which the upper electrode 30 is viewed from the lower side (base 20 side). As described above, the electrode plate 34 is provided on the bottom surface of the upper electrode 30. The electrode plate 34 has a substantially disk shape. The electrode plate 34 has a facing surface 60 that faces the wafer W. The facing surface 60 is a substantially circular region in plan view. In the facing surface 60, a large number of gas ejection holes 34a are provided. In FIG. 3, illustration of the gas ejection holes 34a is omitted. Each gas ejection hole 34a communicates with any one of respective gas chambers obtained by dividing the gas diffusion chamber 37 via a gas flow hole 36b.

The facing surface 60 is divided into a plurality of divided regions 61 corresponding to respective gas chambers obtained by dividing the gas diffusion chamber 37. In FIG. 3, the divided region 61a, in which the gas ejection holes 34a communicating with the first gas diffusion chamber 37a are provided, of the facing surface 60 is illustrated by a broken line. In the present embodiment, the second gas diffusion chamber 37b is further divided into four gas chambers in the circumferential direction. In FIG. 3, the divided regions 61b to 61e, which are provided with the gas ejection holes 34a communicating with the four gas chambers obtained by dividing the second gas diffusion chamber 37b, are illustrated by broken lines.

The upper electrode 30 is configured such that the flow rate of the processing gas to be supplied for each of the divided regions 61 is capable of being adjusted by controlling the flow rate of the gas supplied to each gas chamber obtained by dividing the gas diffusion chamber 37.

As described above, the substrate processing apparatus 10 is configured to be capable of performing plasma etching by supplying the processing gas to the wafer W at different flow rates from the upper electrode 30 for the respective divided regions 61. For each region corresponding to each of the divided regions 61 of the upper electrode 30, the progressing speed of the etching processing of the wafer W varies depending on the flow rate of the supplied processing gas. Hereinafter, regions of the wafer W corresponding to the respective divided regions 61 of the upper electrode 30 will be referred to as "corresponding regions." The corresponding regions of the wafer W corresponding to the divided regions 61 of the upper electrode 30 correspond to the ranges obtained by projecting the ranges of the divided regions 61 onto the wafer W from the upper electrode 30 side. For example, the corresponding region of the wafer W corresponding to the divided region 61a of the upper electrode 30 corresponds to the range obtained by projecting the range of the divided region 61a onto the wafer W from the upper electrode 30 side.

[Configuration of Controller]

Figure 4:
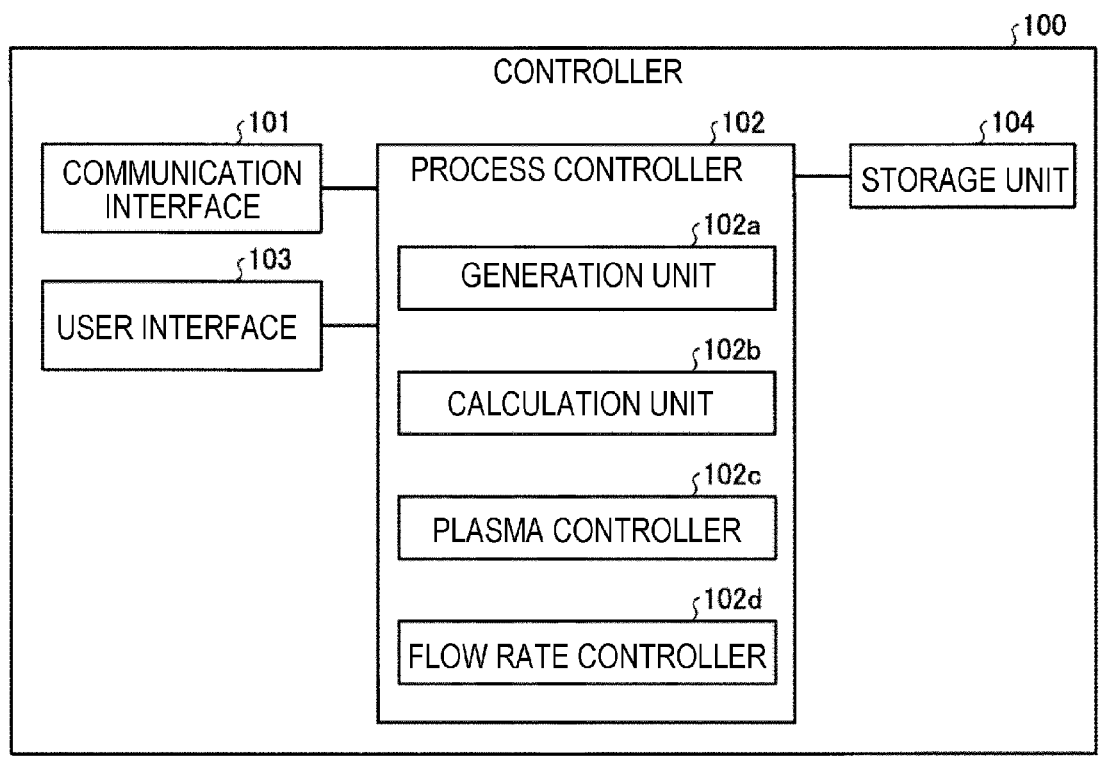
FIG. 4 is a block diagram illustrating a schematic configuration of a controller that controls a substrate processing apparatus according to an embodiment.

Next, a controller 100 will be described in detail. FIG. 4 is a block diagram illustrating a schematic configuration of a controller that controls a substrate processing apparatus according to an embodiment. The controller 100 includes a communication interface 101, a process controller 102, a user interface 103, and a storage unit 104.

The communication interface 101 is configured to communicate with a measurement device 11 through a network N, and transmits/receives various data to/from the measurement device 11. For example, the communication interface 101 receives CD data transmitted from the measurement device 11.

The process controller 102 includes a central processing unit (CPU) so as to control each unit of the substrate processing apparatus 10.

The user interface 103 includes, for example, a keyboard configured to allow a process manager to input commands in order to manage the substrate processing apparatus 10 therethrough, and a display configured to visualize and display an operation situation of the substrate processing apparatus 10.

The storage unit 104 stores, for example, a control program (software) for implementing various processings executed in the substrate processing apparatus 10 under the control of the process controller 102, and a recipe storing, for example, processing condition data. Meanwhile, the control program and the recipe of the processing condition data or the like may be used in the state of being stored in a computer-readable computer-recording medium (e.g., a hard disk, an optical disk such as a DVD, a flexible disk, or a semiconductor memory), or may be used on-line by causing the control program and the recipe to be transmitted from another device via, for example, a dedicated line at any time.

The process controller 102 includes an internal memory that stores programs or data, reads a control program stored in the storage unit 104, and executes a processing of the read control program. For example, the processor controller 102 executes the processing of a flow rate control method by executing the processing of the control program. The process controller 102 functions as various processing units as the control program operates. For example, the process controller 102 has functions of a generation unit 102a, a calculation unit 102b, a plasma controller 102c, and a flow rate controller 102d. Meanwhile, in the substrate processing apparatus 10 according to the present embodiment, the case where the process controller 102 has the functions of the generation unit 102a, the calculation unit 102b, the plasma controller 102c, and the flow rate controller 102d is described as an example. However, the functions of the generation unit 102a, the calculation unit 102b, the plasma controller 102c, and the flow rate controller 102d may be implemented in the manner of being distributed to a plurality of controllers.

By the way, in a substrate processing such as plasma etching, it is desired that the CD range (the difference between the maximum CD value and the minimum CD value) on the entire surface of the wafer W is small and the average CD value is close to a target value. Meanwhile, in the substrate processing, the progress of processing varies depending on the flow rate of the supplied processing gas. For example, in a plasma etching, the progressing speed of etching varies with the flow rate of the supplied processing gas. Therefore, in the substrate processing apparatus 10 according to the present embodiment, using the flow rate of the processing gas supplied from each of the divided regions 61 as a parameter, and using a prediction model for predicting the CD at a predetermined measurement point of the wafer W, the situation where the range of the CD of the entire surface is smaller and the average CD value is close to the target value is implemented.

Next, data used for generating a prediction model will be described. In order to obtain the data used for generating a prediction model, the substrate processing apparatus 10 controls the valve group 42 and the flow rate controller group 44 so as to individually vary the flow rates of the processing gas supplied from the respective divided regions 61 of the upper electrode 30 in several levels, and replaces wafers W at respective flow rates so as to individually perform the plasma etching actually performed on respective wafers W. For example, the substrate processing apparatus 10 individually controls the flow rates of the processing gas in the respective divided regions 61 to three or more flow rates, and replaces wafers W at the respective flow rates, whereby the actually performed plasma etching is individually performed. As an example, in the case where the flow rate of a standard processing gas at the time of performing the plasma etching is set to $\alpha$ and the width at which the flow rate of the processing gas is changed is set to $\beta$, the substrate processing apparatus 10 sets the flow rate of the processing gas supplied from each of the divided regions 61 to $\alpha$, and performs the plasma etching on a wafer W. In addition, the substrate processing apparatus 10 sets the flow rate of the processing gas supplied from any one of the divided regions 61 to $\alpha+\beta$ and sets the flow rate of the processing gas supplied from the other divided regions 61 to $\alpha$, and performs the plasma etching on the wafer. In addition, the substrate processing apparatus 10 sets the flow rate of the processing gas supplied from any one of the divided regions 61 to $\alpha-\beta$ and sets the flow rate of the processing gas supplied from the other divided regions 61 to $\alpha$, and performs the plasma etching on the wafer. The substrate processing apparatus 10 perform the plasma etching on the wafer W while sequentially changing the divided regions 61 for changing the flow rate of the processing gas. Meanwhile, when obtaining data used for generating a prediction model, the flow rate of the processing gas supplied from each of the divided regions 61 does not necessarily have to be changed individually. That is, when obtaining data used for generating a prediction model, the flow rates of the processing gas in the plurality of divided regions 61 may be changed for each wafer W. For example, with respect to the plurality of divided regions 61, which are spaced apart from each other by a predetermined distance or more and thus the influence of the processing gas on each other is small, the flow rates of the processing gas may be changed at the same timing. In addition, when obtaining data used for generating a prediction model, each of the flow rates of the processing gas in all the divided regions 61 may be changed for each wafer W.

Each wafer W on which the processing gas is supplied from each of the divided regions 61 and the plasma etching is performed is transported to the measurement device 11. With respect to each of the transported wafers W, the measurement device 11 measures the CD of a measurement point using a predetermined position as the measurement point. For example, the measurement device 11 individually changes the flow rates of the processing gas supplied from the divided regions 61 to three flow rates α, α+β, and α−β, and measures the CD of each measurement point of each of the wafers W on which the plasma etching has been performed. The measurement device 11 transmits the measured CD data of each measurement point to the substrate processing apparatus 10.

Next, a prediction model will be described. In the present embodiment, a description will be made of a prediction model in which the CD of a measurement point is modeled with a linear function of the flow rate of the processing gas supplied from each divided region 61 obtained by dividing the upper electrode 30.

The processing gas ejected from the corresponding divided regions 61 of the upper electrode 30 is supplied to the corresponding regions of the wafer W which correspond to the divided regions 61 of the upper electrode 30, respectively. For example, the processing gas ejected from the divided regions 61a is supplied to corresponding regions which correspond to the divided regions 61a of the wafer W, respectively. In addition, in each corresponding region, the processing proceeding speed of plasma etching is changed since the processing gas supplied to another corresponding region such as, for example, an adjacent corresponding region, diffuses and arrives at each corresponding region and each corresponding region is influenced by the processing gas supplied to other corresponding regions. The CD of each measurement point may be expressed as in the following Equation 1 when it is modeled with a quadratic function.

$$CD_m = \sum_n A_{22\_mn} Q_n^2 + \sum_n A_{21\_mn} Q_n + A_{20\_m} \qquad \text{Equation 1}$$

Here, m is a number for identifying measurement points. For example, when there are 400 measurement points, m ranges from 1 to 400. n is the number of each divided region 61 obtained by dividing the upper electrode 30. $CD_m$ represents the CD of the measurement point of number m. $Q_n$ represents the flow rate of the processing gas supplied from the divided region 61 of number n. $A_{22\_mn}$, $A_{21\_mn}$, and $A_{20\_m}$ are coefficients of quadratic functions, respectively.

In addition, the CD of each measurement point may be expressed as in the following Equation 2 when modeled by a linear function.

$$CD_m = \sum_n A_{11\_mn} \cdot Q_n + A_{10\_m} \qquad \text{Equation 2}$$

Here, $A_{11\_mn}$ and $A_{10\_m}$ are coefficients of a linear function, respectively.

In the case of generating a prediction model, the substrate processing apparatus 10 controls the valve group 42 and the flow rate controller group 44 so as to individually vary the flow rates of the processing gas supplied from the respective divided regions 61 of the upper electrode 30 in several levels, and replaces wafers W at respective flow rates so as to individually perform the actually performed plasma etching. For example, the substrate processing apparatus 10 individually controls the flow rates of the processing gas in the respective divided regions 61 to three or more flow rates, and replaces wafers W at the respective flow rates, whereby the actually performed plasma etching is individually performed. As an example, the substrate processing apparatus 10 individually changes the flow rates of the processing gas supplied from the respective divided regions 61 to α, α+β, and α−β, and performs a plasma etching on respective wafers W.

Then, each wafer W on which the plasma etching has been performed at each flow rate is moved to the measurement device 11, and the CD of a measurement point is measured by the measurement device 11 using a predetermined position on the wafer W as the measurement point. That is, the CD of each measurement point on each of the wafers W on each of which the plasma etching has been performed in the state where the flow rates of the processing gas supplied from the respective divided regions 61 have been set to three flow rates α, α+β, and α−β, respectively. The measurement device 11 transmits the measured CD data of each measurement point to the substrate processing apparatus 10. The transmitted CD data is recorded with the CD value of each measurement point on each of the wafers W on each of which the plasma etching has been performed in the state where the flow rates of the processing gas supplied from the respective divided regions 61 have been set to three flow rates α, α+β, and α−β, respectively.

The generation unit 102a generates a prediction model from the received CD data. For example, the generation unit 102a performs fitting on Equation 2 using the CD of each measurement point and the flow rate of the processing gas supplied from each of the divided regions 61 based on the CD data received from the measurement device 11, thereby obtaining the values of the coefficients $A_{11\_mn}$ and $A_{10\_m}$. For example, the generation unit 102a obtains, based on the CD data received from the measurement device 11, the values of the coefficients $A_{11\_mn}$ and $A_{10\_m}$ that minimize the error between the CD at each measurement point, which is calculated using Equation 2 from the CD of each measurement point and from the flow rate of the processing gas supplied from each of the divided regions 61, and the CD of each measurement point, which is actually measured when the CD of each measurement point is calculated.

When the values of the coefficients $A_{11\_mn}$ and $A_{10\_m}$ are obtained, $CD_m$ can be calculated from the flow rate $Q_n$ of each divided region 61 using the above-mentioned Equation 2.

The generation unit 102a generates Equation 2 in which the obtained coefficients $A_{11\_mn}$ and $A_{10\_m}$, as the prediction model.

Using the prediction model generated by the generation unit 102a, the calculation unit 102b calculates the target flow rate of the processing gas supplied from each divided region 61 where the CD of a measurement point satisfies a predetermined condition. For example, using the prediction model, the calculation unit 102b calculates the flow rate of the processing gas supplied from each of the divided regions 61 where the square sum of errors of the CDs of respective measurement points with respect to the target value μ becomes minimum.

A method of calculating the flow rate of the processing gas supplied from each of the divided regions 61 where the square sum of errors becomes minimum will be specifically described.

In a substrate processing such as, for example, a plasma etching, it is desired that the range of CD on the entire surface of a wafer W is small and the average CD value is close to the target value set as a target dimension. Therefore, with respect to all the measurement points, the flow rate $Q_n$ of each divided region 61 where $CD_m$ is substantially the target value μ ($CD_m \approx \mu$) is assumed as $Q^*_n$.

The CD of each measurement point sometimes has an error with respect to the target value μ due to, for example, a variation in CD at each measurement point before a substrate processing or influence of the substrate processing. Therefore, when the flow rate of the processing gas supplied from each divided region 61 is $Q^*_n$, the $CD_m$ of each measurement point may be expressed as in the following Equation 3.

$$\mu + \varepsilon_m = \sum_n A_{11\_mn} \cdot Q^*_n + A_{10\_m} \qquad \text{Equation 3}$$

Here, $\varepsilon_m$ is the error of CD with respect to the target value μ at the measurement point of number m.

From Equation 3, the square sum of errors of the respective measurement points may be expressed as in the following Equation 4.

$$\sum_m \varepsilon_m^2 = \sum_m \left\{ \sum_n A_{11\_mn} \cdot Q^*_n + A_{10\_m} - \mu \right\}^2 \qquad \text{Equation 4}$$

The point at which the square sum of errors expressed by Equation 4 becomes minimum is a point where the minimum value is obtained. At the minimum value, Equation 4 satisfies the following Equation (5-1) and satisfies Equation (5-2) from Equation (5-1).

Equation 5

$$\frac{\partial}{\partial Q^*_1} \sum_m \varepsilon_m^2 = \sum_m 2 A_{11\_m1} \left\{ \sum_n A_{11\_mn} \cdot Q^*_n + A_{10\_m} - \mu \right\} = 0 \qquad (5\text{-}1)$$

$$\sum_n Q^*_n \sum_m A_{11\_m1} \cdot A_{11\_mn} = \sum_m A_{11\_m1}(\mu - A_{10\_m}) \qquad (5\text{-}2)$$

Equation 5-2 may be expressed by the following Equation (6-1) when $x_{l,n}$ is expressed by Equation (6-2) and $y_l$ is expressed by Equation (6-3). For example, when the number of measurement points is 400, in Equation (6-2) and Equation (6-3), the sum is obtained with m being 1 to 400.

Equation 6

$$\sum_n x_{1,n} \cdot Q^*_n = y_1 \qquad (6\text{-}1)$$

-continued $$x_{1,n} = \sum_m A_{11\_m1} \cdot A_{11\_mn} \qquad (6\text{-}2)$$

$$y_1 = \sum_m A_{11\_m1}(\mu - A_{10\_m}) \qquad (6\text{-}3)$$

Here, l is the number of each divided region 61 obtained by dividing the upper electrode 30.

Equation (6-1) may be expressed as a matrix calculation as in the following Equation 7.

$$\begin{bmatrix} x_{1,1} & x_{1,2} & \cdots & x_{1,n} \\ x_{2,1} & x_{2,2} & \cdots & x_{2,n} \\ \vdots & & & \vdots \\ x_{l,1} & x_{l,2} & \cdots & x_{l,n} \end{bmatrix} \begin{bmatrix} Q^*_1 \\ Q^*_2 \\ \vdots \\ Q^*_n \end{bmatrix} = \begin{bmatrix} y_1 \\ y_2 \\ \vdots \\ y_l \end{bmatrix} \qquad \text{Equation 7}$$

The matrix repressed in Equation 7 may be transformed into the matrix of the following Equation 8 by obtaining the inverse matrix.

$$\begin{bmatrix} Q^*_1 \\ Q^*_2 \\ \vdots \\ Q^*_n \end{bmatrix} = \begin{bmatrix} x_{1,1} & \cdots & x_{1,n} \\ \vdots & & \vdots \\ x_{l,1} & \cdots & x_{l,n} \end{bmatrix}^{-1} \begin{bmatrix} y_1 \\ \vdots \\ y_l \end{bmatrix} \qquad \text{Equation 8}$$

$x_{l,n}$ of the matrix may be calculated by substituting $A_{11\_mn}$ and $A_{11\_mn}$ corresponding to $A_{11\_ml}$ into Equation (6-2). $y_{l,n}$ of the matrix may also be calculated by substituting $A_{10\_mn}$ and $A_{11\_mn}$ corresponding to $A_{11\_mn}$ into Equation (6-3).

The calculation unit 102b calculates the flow rate $Q^*_n$ of the processing gas supplied from each of the divided regions 61 where the square sum of errors becomes minimum, by solving the matrix of Equation 8.

Figure 5:
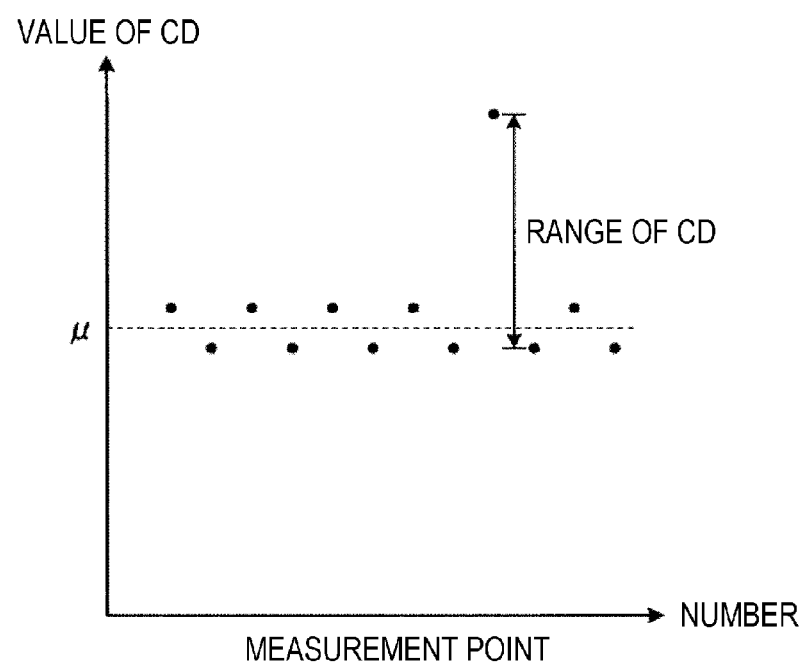
FIG. 5 is a diagram for explaining an example of a relationship between a square sum of errors and a range CD.

By the way, even if the square sum of errors becomes minimum, the CD range may not be small in some cases. FIG. 5 is a diagram for explaining an example of a relationship between a square sum of errors and a range of CD. The horizontal axis of FIG. 5 represents the number of a measurement point. The vertical axis in FIG. 5 represents a CD at a measurement point. The error at each measurement point is a difference between the target value μ and CD. When minimizing the square sum of errors, it suffices that the error at each measurement point becomes small as a whole. Therefore, for example, as represented in FIG. 5, for a target value μ at one measurement point, even if the error is large, when errors are small with respect to the target value μ at many other measurement points, the square sum of errors becomes small. Meanwhile, the range of CD is the difference between the maximum value of CD and the minimum value of CD. In the example of FIG. 5, the range of CD range is not small.

However, there is a strong positive correlation between the range of CD and the dispersion of errors. It is considered that the flow rate of the processing gas supplied from each of the divided regions 61 where the range of CD becomes minimum is in the vicinity of the flow rate $Q^*_n$ of the processing gas supplied from each of the divided regions 61 where the square sum of errors becomes minimum.

Therefore, the calculation unit 102b calculates the target flow rate of the processing gas supplied from each of the divided regions 61 where the range of CD of each measurement point becomes the smallest by changing the flow rate $Q_n$ of the processing gas supplied from each of the divided regions 61 with reference to the flow rate $Q^*_n$ of the processing gas supplied from each of the divided regions 61 where the square sum of errors becomes the smallest. For example, the calculation unit 102b calculates the CD of each measurement point by individually changing the flow rates of the processing gas supplied from the respective divided regions 61 in plus and minus by a predetermined flow rate with reference to the flow rate $Q^*_n$ of the processing gas, and specifies a combination of the flow rates of the processing gas in the respective divided regions 61 where the range of CD becomes the smallest. The predetermined flow rate may be a fixed value, may vary depending on a processing condition, or may be settable from an external device. With respect to the specified combination of the flow rates of the processing gas of the respective divided regions 61, the calculation unit 102b calculates a value obtained by adding a random number individually to the flow rate of the processing gas in each of the divided regions 61 as an initial value and calculates the target flow rate of the processing gas in each of the divided regions 61 where the range of CD becomes the smallest using, for example, a generalized reduced gradient (GRG) method. Meanwhile, with respect to the specified combination of the flow rates of the processing gas of the respective divided regions 61, the calculation unit 102b may repeatedly calculate the CD of each measuring point while changing, randomly or in a predetermined rule, the flow rate of the processing gas in each of the divided regions 61 in a width smaller than the predetermined flow rate, and may calculate the target flow rate of the processing gas in each of the divided regions 61 where the range of CD becomes the smallest.

The plasma controller 102c controls each unit of the substrate processing apparatus 10 and controls the plasma processing. For example, the plasma controller 102c reads, for example, a recipe corresponding to the plasma etching to be executed from the storage unit 104, and controls each unit of the substrate processing apparatus 10 based on, for example, the read recipe.

When the plasma etching is performed on the wafer W placed on the placement table 16 under the control of the plasma controller 102c, the flow rate controller 102d performs control such that the processing gas is supplied from each of the divided regions 61 of the upper electrode 30 at the target flow rate. For example, the flow rate controller 102d controls the valve group 42 and the flow rate controller group 44 such that the processing gas is supplied from each of the divided regions 61 of the upper electrode 30 at the target flow rate.

A wafer W subjected to the plasma etching is transported to the measurement device 11. The measurement device 11 measures the CDs of measurement points of the transported wafer W, and transmits the measured CD data to the substrate processing apparatus 10.

The calculation unit 102b determines from the CD data received from the measurement device 11 whether or not the range of CD is within an allowable range, and when it is determined that the range of CD is not within the allowable range, the calculation unit 102b corrects a prediction model. For example, the calculation unit 102b adds the values of CD-target values µ of the respective measurement points to the functions of the measurement points of respective prediction models, and calculates again the flow rate $Q^*_n$ of each of the divided regions 61 where the square sum of errors becomes minimum. Then, the calculation unit 102b changes the flow rate of each of the divided regions 61 with reference to the flow rate $Q^*_n$ of each of the divided regions 61 where the square sum of errors becomes minimum, and calculates the target flow rate of each of the divided regions 61 in which the range of CDs of respective measurement points becomes the smallest. When the range of CDs at the measurement points of the wafer is not within the allowable range as a result of carrying out the plasma etching on the wafer W at the calculated target flow rate of each of the divided regions 61, the substrate processing apparatus 10 according to the present embodiment performs regeneration of a prediction model.

[Flow of Flow Rate Control]

Figure 6A:
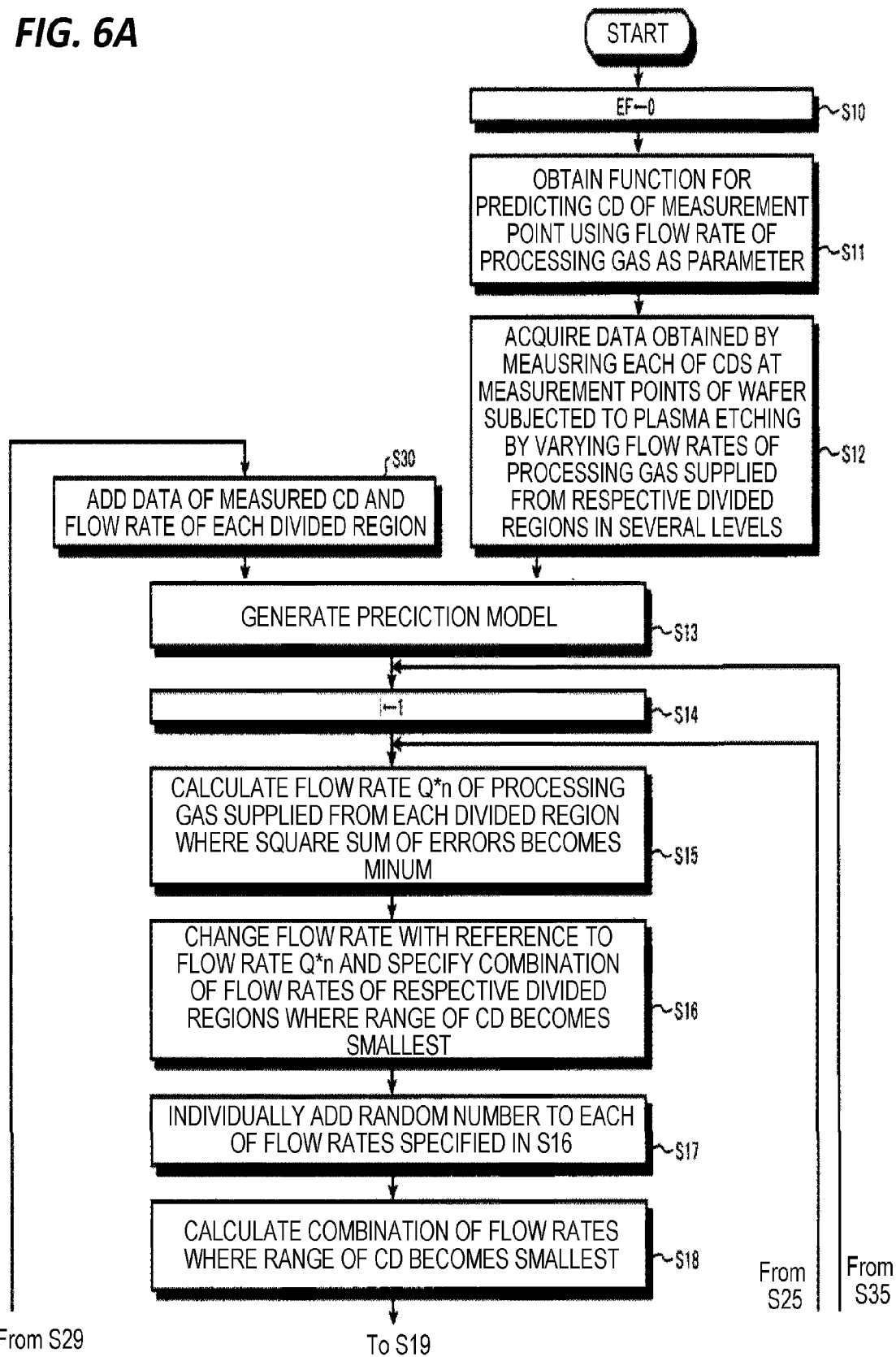
FIGS. 6A and 6B are flowcharts illustrating an example of a flow of a flow rate control method according to a first embodiment.
Figure 6B:
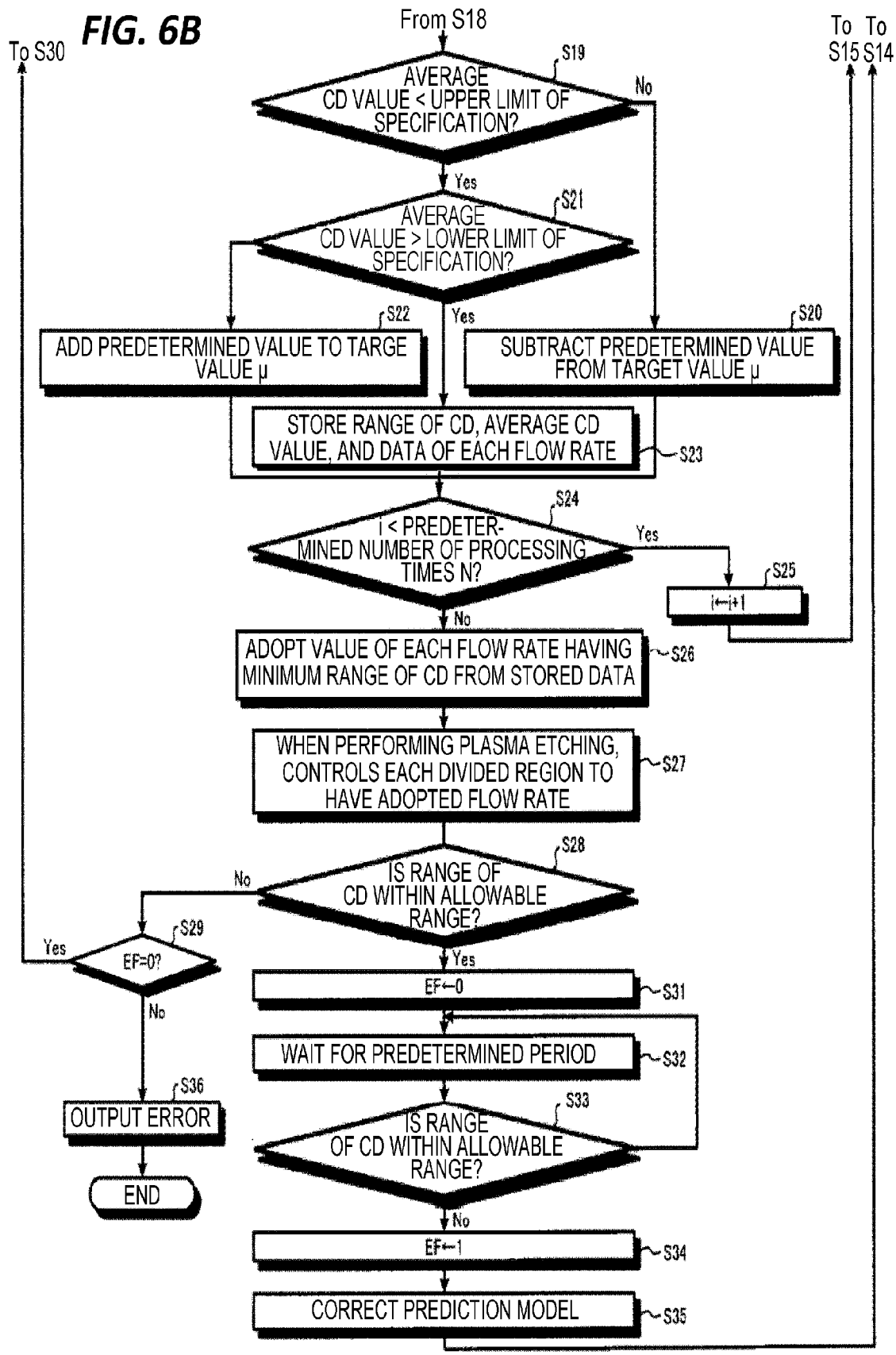

Next, a flow rate control method using the plasma processing apparatus 10 according to the first embodiment will be described. FIGS. 6A and 6B are flowcharts illustrating an example of a flow of a flow rate control method according to a first embodiment.

The generation unit 102a initializes the error flag EF to 0 (step S10). The generation unit 102a obtains a function for predicting the CD of a measurement point using the flow rate of the processing gas in each divided region 61 of the upper electrode 30 as a parameter (step S11). In the present embodiment, the generation unit 102a obtains a function for predicting the CD of the measurement point as a linear function of the flow rate of the processing gas supplied from each divided region 61 of the upper electrode 30. For example, the generation unit 102a obtains Equation 2.

The generation unit 102a acquires data obtained by measuring each of CDs at the measurement points of a wafer W subjected to the plasma etching by individually varying the flow rates of the processing gas supplied from the respective divided regions 61 of the upper electrode 30 in several levels (step S12). For example, the substrate processing apparatus 10 controls the valve group 42 and the flow rate controller group 44 so as to vary the flow rates of the processing gas supplied from the respective divided regions 61 of the upper electrode 30 in several levels, and replaces wafers W at respective flow rates so as to individually perform the actually performed plasma etching. Each wafer W on which the plasma etching has been performed at each flow rate is moved to the measurement device 11, and the CD of a measurement point is measured by the measurement device 11 using a predetermined position on the wafer W as the measurement point. The measurement device 11 transmits the measured CD data of each measurement point to the substrate processing apparatus 10. By receiving the measured CD data of each measurement point from the measurement device, the generation unit 102a acquires data obtained by measuring CDs at the measurement points of a wafer W subjected to the plasma etching by varying the flow rates of the processing gas supplied from the respective divided regions 61 of the upper electrode 30 in several levels.

The generation unit 102a generates a prediction model from the acquired data (step S13). For example, the generation unit 102a performs fitting on Equation 2 using the measured CD of each measurement point and the flow rate of the processing gas supplied from each of the divided regions 61 of the upper electrode 30 with respect to the obtained function, and obtains a function for predicting the CD of a measurement point from the flow rate of the processing gas supplied from each divided region 61 of the upper electrode 30, as a prediction model.

The calculation unit 102b initializes a counter i to 1 (step S14). Then, using the generated prediction model, the calculation unit 102b calculates the flow rate $Q^*_n$ of the processing gas supplied from each of the divided regions 61 where the square sum of errors of the CDs of respective measurement points with respect to the target value μ becomes minimum (step S15).

The calculation unit 102b calculates the CD of each measurement point by individually changing the flow rates of the processing gas supplied from the respective divided regions 61 in plus and minus by a predetermined flow rate with reference to the flow rate $Q^*_n$ of each of the divided regions 61, and specifies a combination of the flow rates in the respective divided regions 61 where the range of CD becomes the smallest (step S16).

The calculation unit 102b individually obtains and adds a random number to the specified flow rates of the respective divided regions 61 (step S17). The calculation unit 102b calculates the flow rate of each of the divided regions 61 where the range of CD becomes the smallest by, for example, the GRG method using a value obtained by adding the random number, as an initial value (step S18).

The calculation unit 102b obtains the average CD value of the respective measurement points when the flow rate of the processing gas supplied from each of the divided regions 61 is the calculated flow rate, and determines whether or not the average CD value less than the upper limit of a required specification (step S19). When it is determined that the average CD value is not less than the upper limit of the required specification (step S19: No), the calculation unit 102b subtracts a predetermined value from the target value μ (step S20).

Meanwhile, when the average CD value is less than the upper limit of the required specification (step S19: Yes), the calculation unit 102b determines whether or not the average CD value is larger than the lower limit of the required specification (step S21). When it is determined that the average CD value is equal to or less than the lower limit of the required specification (step S21: No), the calculation unit 102b adds a predetermined value to the target value μ (step S22).

Meanwhile, when it is determined that the average CD value is larger than the lower limit of the required specification (step S21: Yes), the calculation unit 102b stores the average CD value, the range of CD, and the data of the flow rate of each divided region 61 (step S23).

The calculation unit 102b determines whether or not counter i is smaller than a predetermined number of processing times N (step S24). When it is determined that the counter i is smaller than the predetermined number of processing times N (step S24: Yes), the calculation unit 102b adds 1 to the counter i (step S25), and proceeds to the above-described step S15.

When the counter i is equal to or larger than the predetermined number of processing times N (step S24: No), the calculation unit 102b adopts the flow rate of each divided region 61 of the data having the smallest range of CD from the stored data, as the target flow rate (Step S26).

When the plasma etching is performed on a wafer W placed on a placement region 18a of the placement table 16, the flow rate controller 102d performs a control such that the flow rate of the processing gas supplied from each of the divided regions 61 of the upper electrode 30 becomes the adopted target flow rate (step S27).

The wafer W subjected to the plasma etching is transported to the measurement device 11. The measurement device 11 measures the CDs of measurement points of the transported wafer W, and transmits the measured CD data to the substrate processing apparatus 10.

The calculation unit 102b determines from the CD data received from the measurement device 11 whether or not the range of CD is within the allowable range (step S28). When it is determined that the range of CD is not within the allowable range (step S28: No), the calculation unit 102b determines whether or not an error flag EF is 0 (step S29). When it is determined that the error flag EF is 0 (step S29: Yes), the generation unit 102a adds, as data for generating a prediction model, data of measured CDs and flow rates of the processing gas supplied from the respective divided regions 61 of the upper electrode 30 added (step S30), and the process returns to step S13 again to regenerate a prediction model from the data of measured CDs and the flow rates of the processing gas supplied from the respective divided regions 61, and the data acquired in step S12.

Meanwhile, when it is determined that the range of CD is within the allowable range (step S28: Yes), the calculation unit 102b initializes the error flag EF to 0 (step S31). Then, the calculation unit 102b waits for a processing for a predetermined period (step S32). The predetermined period may be, for example, a period during which the plasma etching of a predetermined number of wafers W is performed, or may be a period during which a predetermined period of time elapses.

For the predetermined period, the substrate processing apparatus 10 performs the plasma etching on the wafers W while performing a control such that the flow rate of the processing gas supplied from each of the divided regions 61 of the upper electrode 30 becomes the adopted target flow rate.

After the predetermined period, the calculation unit 102b determines from the CD data received from the measurement device 11 whether or not the range of CD is within the allowable range (step S33). When it is determined that the range of the CD is within the allowable range (step S33: Yes), the process returns to step S32 again to wait for the predetermined period.

Meanwhile, when it is determined that the range of CD is not within the allowable range (step S33: Yes), the calculation unit 102b sets 1 in the error flag EF (step S34). The calculation unit 102b corrects the prediction model (step S35). For example, the calculation unit 102b performs correction by adding the CD-target value μ of each measurement point to the function of each measurement point of each prediction model. Then, the calculation unit 102b returns to step S14 again and calculates the target flow rate again.

When the error flag EF is not 0 (step S29: No), the range of CD is not within the allowable range even in the corrected prediction model. In this case, since it is impossible to generate an appropriate prediction model from the acquired data, the generation unit 102a outputs an error (step S36) and terminates the processing. For example, the generation unit 102a outputs a message, "Please acquire again the data of measurement points of wafers W subjected to the plasma etching by individually varying the flow rates of the processing gas supplied from the respective divided regions 61 of the upper electrode 30 in several levels," to the user interface 103 and terminates the processing.

When an error is output, the process manager controls the substrate processing apparatus 10 to individually vary the flow rate of the processing gas supplied from each of the divided regions 61 of the upper electrode 30 in several levels, replace the wafers W at respective flow rates so as to individually perform the plasma etching to be actually performed on the wafers, acquire data for generating a prediction model again, and then perform the flow rate control method according to the present embodiment.

As described above, in the substrate processing apparatus 10 according to the first embodiment, the upper electrode 30 (gas supply unit) is disposed in the processing container 12 to face a wafer W, and the flow rate of the processing gas to be supplied is capable of being adjusted for each of the divided regions 61 obtained by dividing the facing surface 60 that faces the wafer W. The substrate processing apparatus 10 calculates a target flow rate of the processing gas of each divided region 61 where the CD of a measurement point satisfies a predetermined condition using a prediction model for predicting the CD at a predetermined measurement point of the wafer W when the plasma etching is performed on the wafer W using the flow rate of the processing gas in each of the divided regions 61 as a parameter. When the plasma etching is performed on a wafer W, the substrate processing apparatus 10 performs a control such that the flow rate of the processing gas supplied from each of the divided regions 61 of the upper electrode 30 becomes the calculated target flow rate. Thus, the substrate processing apparatus 10 is capable of controlling the flow rate of the processing gas supplied from each of the divided regions 61 such that the CD of a measurement point of a wafer W satisfies a predetermined condition.

In addition, a plurality of measurement points is defined on a wafer W. Using the prediction model, the substrate processing apparatus 10 according to the first embodiment calculates the flow rate of the processing gas in each of the divided regions 61 where the square sum of the errors of the CDs of respective measurement points with respect to the target value becomes minimum. The substrate processing apparatus 10 calculates the target flow rate of the processing gas in each of the divided regions where the difference between the maximum and minimum values of CD at each measurement point becomes the smallest by changing the flow rate of the processing gas in each of the divided regions 61 with reference to the calculated flow rages of the processing gases in the respective divided regions 61. Thus, the substrate processing apparatus 10 is capable of accurately calculating the flow rate of the processing gas in each of the divided regions 61 where the uniformity of CD of the wafer W increases.

Further, the substrate processing apparatus 10 according to the first embodiment generates a prediction model from data obtained by measuring the CDs of measurement points when a plasma etching is performed on a wafer W while controlling the flow rates of the processing gas in the respective divided regions 61 to three or more different flow rates. Thus, the substrate processing apparatus 10 is capable of generating a prediction model that is accurately predicting a CD at a measurement point.

Second Embodiment

Next, a second embodiment will be described. Since the configurations of a substrate processing system 1 and a substrate processing apparatus 10 according to the second embodiment are the same as those of the substrate processing system 10 and the substrate processing apparatus 10 according to the first embodiment illustrated in FIGS. 1 to 4, descriptions thereof will be omitted.

The generation unit 102a generates a first prediction model by modeling the CDs of measurement points with a linear function of the flow rate of a processing gas from received CD data. For example, as in the first embodiment, the generation unit 102a obtains, as a first prediction model, a function for predicting the CD of a measurement point with a linear function of the flow rate of the processing gas of each of the divided regions by performing fitting using the CD of each measurement point and the flow rate of the processing gas supplied from each of the divided regions 61, based on CD data of the measurement points of the respective wafers W subjected to plasma etching by setting the flow rates, which are received from the measurement device 11, of the processing gas supplied from respective divided regions 61 to three flow rates of $\alpha$, $\alpha+\beta$, and $\alpha-\beta$. For example, the generation unit 102a obtains Equation 2 as the first prediction model.

In addition, the generation unit 102a generates a second prediction model by modeling the CDs of measurement points with a quadratic function of the flow rate of a processing gas from the received CD data. For example, the generation unit 102a obtains the values of coefficients $A_{22\_mn}$, $A_{21\_mn}$, and $A_{20\_m}$ by performing fitting with respect to Equation 1 described above using the CD of each of the measurement points and the flow rate of the processing gas supplied from each of the divided regions 61, based on CD data of the measurement points of the respective wafers W subjected to plasma etching by setting the flow rates, which are received from the measurement device 11, of the processing gas supplied from respective divided regions 61 to three flow rates of $\alpha$, $\alpha+\beta$, and $\alpha-\beta$.

When the values of the coefficients of $A_{22\_mn}$, $A_{21\_mn}$, and $A_{20\_m}$ are obtained, $CD_m$ according to the flow rate $T_1$ can be calculated from the above-described Equation 2.

Using the first and second prediction models generated by the generation unit 102a, the calculation unit 102b calculates the target flow rate of the processing gas supplied from each divided region 61 where the CD of a measurement point satisfies a predetermined condition. For example, using the first prediction model, the calculation unit 102b calculates the flow rate of the processing gas of each of the divided regions 61 where the square sum of errors of the CDs becomes minimum. Then, as in the first embodiment, using the first prediction model, the calculation unit 102b calculates the flow rate $Q^*_n$ of the processing gas supplied from each of the divided regions 61 where the square sum of errors of the CDs of respective measurement points with respect to the target value $\mu$ becomes minimum (step S15).

In addition, the calculation unit 102b calculates the target flow rate of the processing gas in each of the divided regions where the difference between the maximum and minimum values of CD at each measurement point becomes the smallest by changing the flow rate of the processing gas in each of the divided regions 61 with reference to the calculated flow rages of the processing gases in the respective divided regions 61 and using the second prediction model. For example, the calculation unit 102b calculates the target flow rate of the processing gas supplied from each of the divided regions 61 where the range of CD of each measurement point becomes the smallest by changing the flow rate $Q_n$ of the processing gas of each of the divided regions 61 with reference to the flow rate $Q^*_n$ of the processing gas supplied from each of the divided regions 61 where the square sum of errors becomes, and using the above-mentioned Equation 1. For example, the calculation unit 102b calculates the CD of each measurement point by individually changing the flow rates of the processing gas supplied from the respective divided regions 61 in plus and minus by a predetermined flow rate with reference to the flow rate $Q^*_n$, and specifies a combination of the flow rates of the processing gas supplied from the respective divided regions 61 where the range of CD becomes the smallest. With respect to the specified combination of the flow rates of the processing gas of the respective divided regions 61, the calculation unit 102b calculates a value obtained by adding a random number individually to the flow rate of the processing gas in each of the divided regions 61 as an initial value and calculates the target flow rate of the processing gas in each of the divided regions 61 where the range of CD becomes the smallest using, for example, a GRG method. Meanwhile, with respect to the specified combination of the flow rates of the processing gas of the respective divided regions 61, the calculation unit 102b may repeatedly calculate the CD of each measuring point while changing, randomly or in a predetermined rule, the flow rate of the processing gas in each of the divided regions 61 in a width smaller than the predetermined flow rate, and may calculate the target flow rate of the processing gas in each of the divided regions 61 where the range of CD becomes the smallest.

[Flow of Flow Rate Control]

Figure 7A:
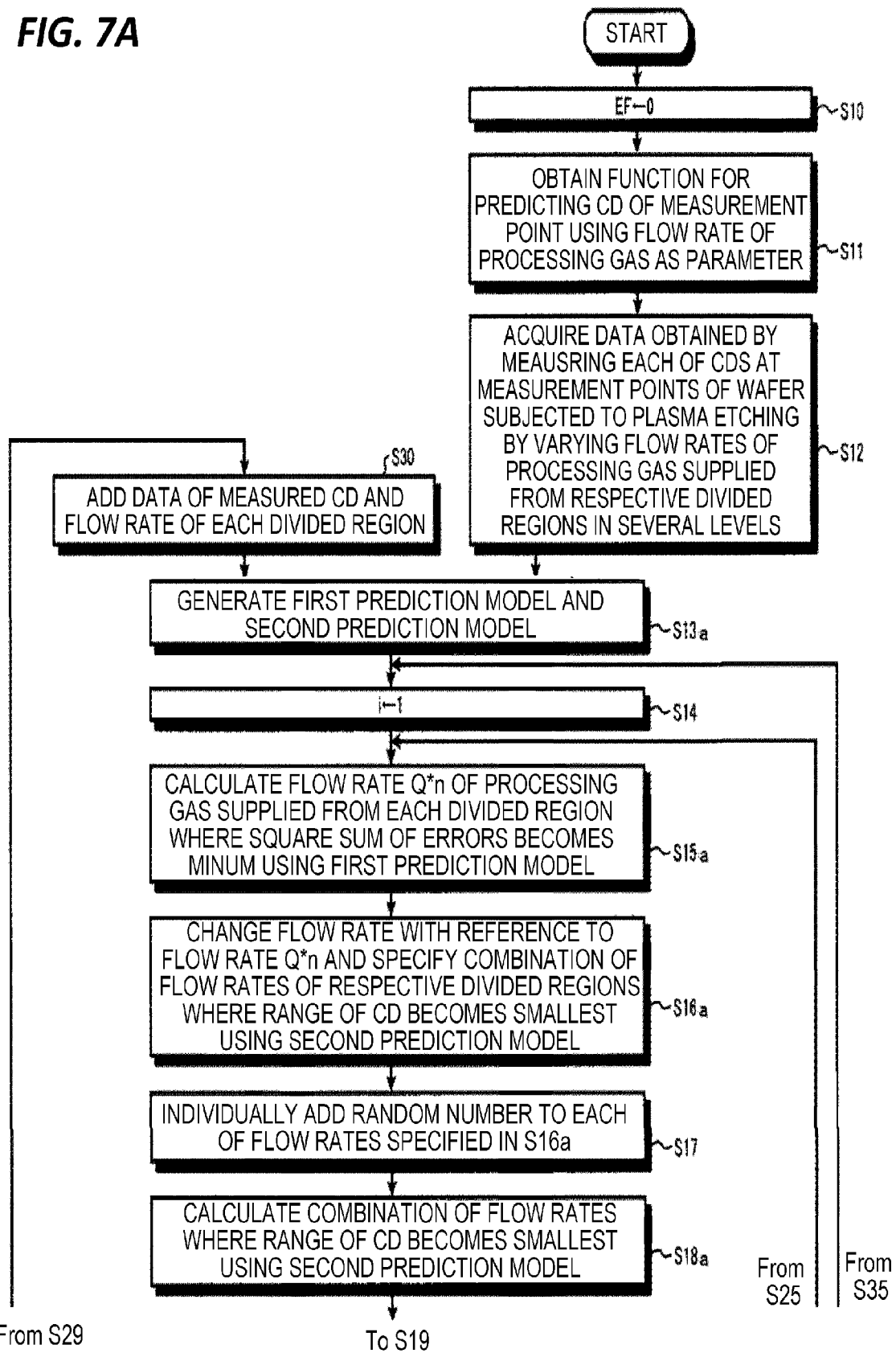
FIGS. 7A and 7B are flowcharts illustrating an example of a flow of a flow rate control method according to a second embodiment.
Figure 7B:
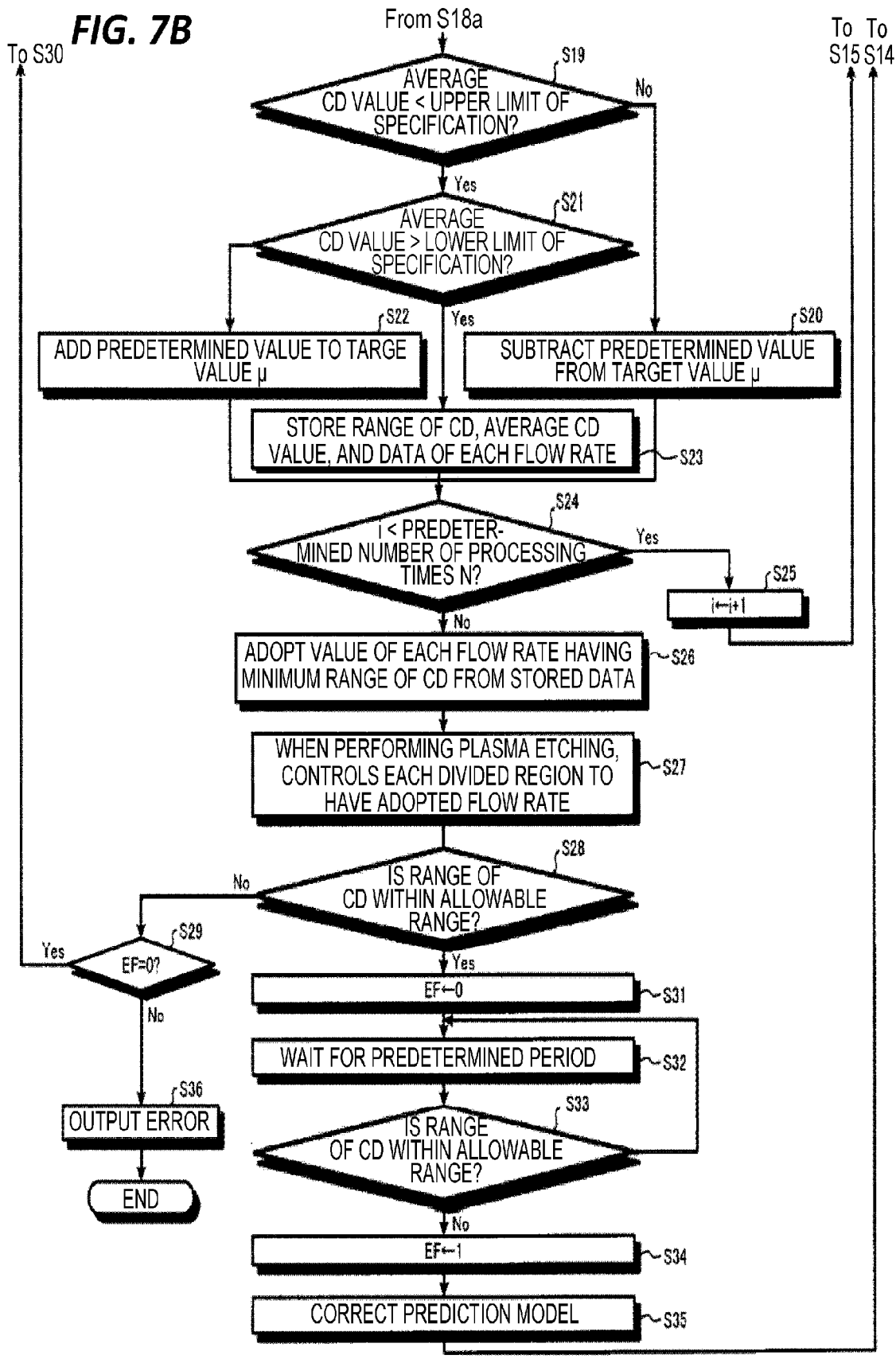

Next, a flow rate control method using the plasma processing apparatus 10 according to the second embodiment will be described. FIGS. 7A and 7B are flowcharts illustrating an example of a flow of a flow rate control method according to a second embodiment. The flow rate control method according to the second embodiment is partially the same as the flow rate control method according to the first embodiment illustrated in FIGS. 6A and 6B. Thus, the same processings will be denoted by the same reference numerals and different portions will be mainly described while omitting the redundant descriptions of the same processings.

From the acquired data, the generation unit 102a generates a first prediction model obtained by modeling CDs of measurement points with a linear function of the flow rate of the processing gas and a second prediction model obtained by modeling CDs of measurement points with a quadratic function of the flow rate of the processing gas (step S13a). For example, the generation unit 102a obtains each of a function for predicting the CD of a measurement point with a linear function of the flow rate of the processing gas supplied from each of the divided regions 61 and a function for predicting the CD of a measurement point with a quadratic function of the flow rate of the processing gas supplied from each of the divided regions 61 by performing using the measured CD of each measurement point and the flow rate of the processing gas supplied from each of the divided regions 61.

Using the generated first prediction model, the calculation unit 102b calculates the flow rate $Q^*_n$ of the processing gas supplied from each of the divided regions 61 where the square sum of errors of the CDs of respective measurement points with respect to the target value $\mu$ becomes minimum (step S15a).

The calculation unit 102b calculates the CD of each measurement point by individually changing the flow rates of the processing gas supplied from the respective divided regions 61 in plus and minus by a predetermined flow rate with reference to the calculated flow rate $Q^*_n$ of the processing gas of each of the divided regions 61, and specifies a combination of the flow rates of the processing gas in the respective divided regions 61 where the range of CD becomes the smallest using the second prediction model (step S16a).

The calculation unit 102b calculates the flow rate of the processing gas of each of the divided regions 61 where the range of CD becomes the smallest by, for example, the GRG method using a value obtained by adding the random number, as an initial value and using the second prediction model (step S18a).

In this way, the substrate processing apparatus 10 according to the second embodiment generates a first prediction model obtained by modeling CDs of measurement points with a linear function of the flow rate of the processing gas. In addition, the substrate processing apparatus 10 generates a second prediction model obtained by modeling CDs of measurement points with a quadratic function of the flow rate of the processing gas. Since the second prediction model is modeled with a quadratic function, it is possible to predict a CD more accurately based on the second prediction model than based on the first prediction model. Using the first prediction model, the substrate processing apparatus 10 calculates the flow rate of the processing gas of each of the divided regions 61 where the square sum of errors of the CDs becomes minimum. In the second prediction model, the flow rate of the processing gas in each of the divided regions 61 where the square sum of errors becomes minimum may not be calculated in some cases. For this reason, using the first prediction model, the substrate processing apparatus 10 calculates the flow rate of the processing gas of each of the divided regions 61 where the square sum of errors becomes minimum. In addition, the substrate processing apparatus 10 calculates the target flow rate of the processing gas in each of the divided regions where the difference between the maximum and minimum values of CD at each measurement point becomes the smallest by changing the flow rate of the processing gas in each of the divided regions 61 with reference to the calculated flow rages of the processing gases in the respective divided regions 61 and using the second prediction model. Thus, the substrate processing apparatus 10 is capable of calculating with high accuracy the flow rate of the processing gas where the uniformity in CD of a wafer W becomes higher, compared to the case where the target flow rate of the processing gas in each of the divided regions 61 is calculated using the first prediction model.

For example, in the above-described embodiments, a case where a substrate processing is performed on a semiconductor wafer as a substrate has been described as an example, but the present disclosure is not limited thereto. The substrate may be any substrate as long as it influences the progress of substrate processing depending on the flow rate of the processing gas.

In addition, in the above-described embodiments, a case where a plasma etching is performed as the substrate processing has been described as an example, but the present disclosure is not limited thereto. The substrate processing may be any substrate processing as long as it influences the progress of substrate processing depending on the flow rate of the processing gas.

Further, in the first and second embodiments described above, the case where the facing surface 60 of the upper electrode 30, which faces a wafer W, is divided into a plurality of divided regions 61 as illustrated in FIG. 3 has been described as an example, but the present disclosure is not limited thereto. For example, by further dividing the gas diffusion chamber 37 of the upper electrode 30 in the radial direction and the circumferential direction with partition wall members, the facing surface 60 may be divided into a larger number of divided regions 61.

According to one aspect of the disclosed substrate processing apparatus, it is possible to control the flow rate of a processing gas supplied from each of divided regions such that the critical dimension of a measurement point of a substrate satisfies a predetermined condition.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a gas supply plate serving as an upper electrode, disposed in a processing container to face a substrate, and configured to adjust a flow rate of a processing gas to be supplied for each of divided regions obtained by dividing a facing surface that faces the substrate;
a calculator configured to calculate a target flow rate of the processing gas of each of the divided regions where a critical dimension of a predetermined measurement point of the substrate satisfies a predetermined condition using a prediction model for predicting the critical dimension at the predetermined measurement point of the substrate when a predetermined substrate processing is performed on the substrate using a flow rate of the processing gas of each of the divided regions as a parameter;
a flow rate controller configured to perform a flow rate control such that the flow rate of the processing gas supplied from each of the divided regions of the gas supply plate becomes the target flow rate calculated by the calculator when performing the substrate processing on the substrate; and
a generator configured to generate the prediction model from data obtained by measuring the critical dimension of the measurement point when the substrate processing is performed on the substrate by controlling the flow rate of the processing gas in each of the divided regions to three or more different flow rates,
wherein the calculator calculates the target flow rate of the processing gas in each of the divided regions in which the critical dimension of the measurement point satisfies a predetermined condition, using the prediction model generated by the generator,
the generator generates a first prediction model obtained by modeling the critical dimension of the measurement point with a linear function of the flow rate of the processing gas and a second prediction model obtained by modeling the critical dimension of the measurement point with a quadratic function of the flow rate of the processing gas, and
the calculator calculates the flow rate of the processing gas in each of the divided regions where a square sum of errors of critical dimensions of respective measurement points is minimized using the first prediction model, changes the flow rate of the processing gas in each of the divided regions with reference to the calculated flow rate of each of the divided regions, and calculates the target flow rate of the processing gas in each of the divided regions where a difference between maximum and minimum values of the critical dimension of each measurement point becomes the smallest using the second prediction model.

2. The substrate processing apparatus of claim 1, wherein a plurality of measurement points is defined on the substrate, and
the calculator calculates the flow rate of the processing gas in each of the divided regions where a square sum of errors of critical dimensions of respective measurement points with respect to the target dimension is minimized using the prediction model, changes the flow rate of the processing gas in each divided region with reference to the calculated flow rate of each of the divided regions, and calculates the target flow rate of the processing gas in each of the divided regions where a difference between maximum and minimum values of the critical dimension of each measurement point becomes smallest.

3. The substrate processing apparatus of claim 2, further comprising:
a generator configured to generate the prediction module from data obtained by measuring the critical dimension of the measurement point when the substrate processing is performed on the substrate by controlling the flow rate of the processing gas in each of the divided regions to three or more different flow rates,
wherein the calculator calculates the target flow rate of the processing gas in each of the divided regions in which the critical dimension of the measurement point satisfies a predetermined condition, using the prediction model generated by the generator.

4. The substrate processing apparatus of claim 3, wherein the generator generates a first prediction model obtained by modeling the critical dimension of the measurement point with a linear function of the flow rate of the processing gas and a second prediction model obtained by modeling the critical dimension of the measurement point with a quadratic function of the flow rate of the processing gas, and
the calculator calculates the flow rate of the processing gas in each of the divided regions where a square sum of errors of critical dimensions of respective measurement points is minimized using the prediction model, changes the flow rate of the processing gas in each of the divided regions with reference to the calculated flow rate of each of the divided regions, and calculates the target flow rate of the processing gas in each of the divided regions where a difference between maximum and minimum values of the critical dimension of each measurement point becomes the smallest using the second prediction model.

5. The substrate processing apparatus of claim 4, wherein the substrate processing is plasma etching and the critical dimension is a width of an etching pattern.

6. The substrate processing apparatus of claim 1, wherein the substrate processing is plasma etching and the critical dimension is a width of an etching pattern.

7. The substrate processing apparatus of claim 1, wherein the gas supply plate includes a first plate and a second plate that detachably supports the first plate.

8. The substrate processing apparatus of claim 7,
wherein the first plate includes the divided regions each including a plurality of ejection holes, and
the second plate includes a gas diffusion chamber and a plurality of gas flow holes allowing the gas diffusion chamber to communicate with the plurality of ejection holes of each of the divided regions of the first plate.

9. A flow rate control method comprising:
providing a substrate processing apparatus including:
a gas supply plate serving as an upper electrode, disposed in a processing container to face a substrate, and configured to adjust a flow rate of a processing gas to be supplied for each of divided regions obtained by dividing a facing surface that faces the substrate;
a calculator configured to calculate a target flow rate of the processing gas of each of the divided regions where a critical dimension of a predetermined measurement point of the substrate satisfies a predetermined condition using a prediction model for predicting the critical dimension at the predetermined measurement point of the substrate when a predetermined substrate processing is performed on the substrate using a flow rate of the processing gas of each of the divided regions as a parameter;
a flow rate controller configured to perform a flow rate control such that the flow rate of the processing gas supplied from each of the divided regions of the gas supply plate becomes the target flow rate calculated by the calculator when performing the substrate processing on the substrate; and
a generator configured to generate the prediction model from data obtained by measuring the critical dimension of the measurement point when the substrate processing is performed on the substrate by controlling the flow rate of the processing gas in each of the divided regions to three or more different flow rates,
wherein the calculator calculates the target flow rate of the processing gas in each of the divided regions in which the critical dimension of the measurement point satisfies a predetermined condition, using the prediction model generated by the generator,
the generator generates a first prediction model obtained by modeling the critical dimension of the measurement point with a linear function of the flow rate of the processing gas and a second prediction model obtained by modeling the critical dimension of the measurement point with a quadratic function of the flow rate of the processing gas, and
the calculator calculates the flow rate of the processing gas in each of the divided regions where a square sum of errors of critical dimensions of respective measurement points is minimized using the first prediction model, changes the flow rate of the processing gas in each of the divided regions with reference to the calculated flow rate of each of the divided regions, and calculates the target flow rate of the processing gas in each of the divided regions where a difference between maximum and minimum values of the critical dimension of each measurement point becomes the smallest using the second prediction model,
supplying, by the gas supply plate, the processing gas from each of divided regions of the gas supply plate;
calculating, by the calculator, the target flow rate of the processing gas; and
performing, by the flow rate controller, the flow rate control such that the flow rate of the processing gas supplied from each of the divided regions of the gas supply plate becomes the calculated target flow rate when performing the substrate processing on the substrate.

10. The flow rate control method of claim 9, wherein the gas supply plate includes a first plate and a second plate that detachably supports the first plate.

11. The flow rate control method of claim 10,
wherein the first plate includes the regions each including a plurality of ejection holes, and
the second plate includes a gas diffusion chamber and a plurality of gas flow holes allowing the gas diffusion chamber to communicate with the plurality of ejection holes of each of the divided regions of the first plate.

12. A non-transitory computer-readable storage medium storing a program that causes the computer to execute a flow rate control process, wherein the flow rate control process includes:
providing a substrate processing apparatus including:
a gas supply plate serving as an upper electrode, disposed in a processing container to face a substrate, and configured to adjust a flow rate of a processing gas to be supplied for each of divided regions obtained by dividing a facing surface that faces the substrate;
a calculator configured to calculate a target flow rate of the processing gas of each of the divided regions where a critical dimension of a predetermined measurement point of the substrate satisfies a predetermined condition using a prediction model for predicting the critical dimension at the predetermined measurement point of the substrate when a predetermined substrate processing is performed on the substrate using a flow rate of the processing gas of each of the divided regions as a parameter; and
a flow rate controller configured to perform a flow rate control such that the flow rate of the processing gas supplied from each of the divided regions of the gas supply plate becomes the target flow rate calculated by the calculator when performing the substrate processing on the substrate; and
a generator configured to generate the prediction model from data obtained by measuring the critical dimension of the measurement point when the substrate processing is performed on the substrate by controlling the flow rate of the processing gas in each of the divided regions to three or more different flow rates,
wherein the calculator calculates the target flow rate of the processing gas in each of the divided regions in which the critical dimension of the measurement point satisfies a predetermined condition, using the prediction model generated by the generator,
the generator generates a first prediction model obtained by modeling the critical dimension of the measurement point with a linear function of the flow rate of the processing gas and a second prediction model obtained by modeling the critical dimension of the measurement point with a quadratic function of the flow rate of the processing gas, and
the calculator calculates the flow rate of the processing gas in each of the divided regions where a square sum of errors of critical dimensions of respective measurement points is minimized using the first prediction model, changes the flow rate of the processing gas in each of the divided regions with reference to the calculated flow rate of each of the divided regions, and calculates the target flow rate of the processing gas in each of the divided regions where a difference between maximum and minimum values of the critical dimension of each measurement point becomes the smallest using the second prediction model,
supplying, by the gas supply plate, the processing gas from each of divided regions of the gas supply plate;
calculating, by the calculator, the target flow rate of the processing gas; and
performing, by the flow rate controller, the flow rate control such that the flow rate of the processing gas supplied from each of the divided regions of the gas supply plate becomes the calculated target flow rate when performing the substrate processing on the substrate.

13. The non-transitory computer-readable storage medium of claim 12, wherein the gas supply plate includes a first plate and a second plate that detachably supports the first plate.

14. The non-transitory computer-readable storage medium of claim 13,
wherein the first plate includes the regions each including a plurality of ejection holes, and
the second plate includes a gas diffusion chamber and a plurality of gas flow holes allowing the gas diffusion chamber to communicate with the plurality of ejection holes of each of the divided regions of the first plate.

\* \* \* \* \*